(12) United States Patent
Chen et al.

(10) Patent No.: US 6,521,481 B1
(45) Date of Patent: Feb. 18, 2003

(54) METHOD FOR CONTROLLING ADHESIVE DISTRIBUTION IN A FLIP-CHIP SEMICONDUCTOR PRODUCT

(75) Inventors: Yu-Wen Chen, Kaohsiung (TW); Hui-Lung Chou, Feng-Shan (TW); Wann-Lung Chien, Pingtung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/041,909

(22) Filed: Jan. 7, 2002

(51) Int. Cl.⁷ .................. H01L 21/44; H01L 21/48; H01L 21/50
(52) U.S. Cl. .............. 438/108; 438/118; 438/124; 438/126; 438/127; 156/48; 156/145; 156/295
(58) Field of Search .................. 438/108, 118, 438/124, 126, 127; 156/48, 145, 295

(56) References Cited

U.S. PATENT DOCUMENTS 6,228,679 B1 * 5/2001 Chiu .................. 438/108
6,291,264 B1 * 9/2001 Tang et al. .................. 438/106
6,391,682 B1 * 5/2002 Tsai et al. .................. 438/108
6,391,683 B1 * 5/2002 Chiu et al. .................. 257/678

* cited by examiner

Primary Examiner—Albert W. Paladini
Assistant Examiner—David A. Zarneke
(74) Attorney, Agent, or Firm—Merchant & Gould P.C.

(57) ABSTRACT

A method for controlling the adhesive distribution in a flip-chip semiconductor product has steps: (a) providing a substrate with a flip-chip electrically mounted on the substrate via multiple bumps, (b) providing an dam along an edge of the flip-chip, and (c) depositing adhesive on the dam to flow into a space between the substrate and a bottom of the flip-chip by capillary effect. The shape of the dam is determined by the density of the multiple bumps to control the flowing speed of the adhesive to obtain a good adhesive distribution.

6 Claims, 2 Drawing Sheets

US 6,521,481 B1

METHOD FOR CONTROLLING ADHESIVE DISTRIBUTION IN A FLIP-CHIP SEMICONDUCTOR PRODUCT

BACKGROUND OF THE INVENTION

1. Field of Invention

The present invention relates to a method for controlling adhesive distribution in a flip-chip semiconductor product, and more particularly to a method that increases the efficiency in a chip bonding procedure, and effectively avoids the generation of air bubbles within the adhesive.

2. Related Art

A flip-chip semiconductor product is a chip having metal bumps formed on the bottom and directly mounted on a substrate by ultrasound or heating techniques. Then adhesive is applied to the metal bumps to prevent oxidization of the metal bumps and further enhance the bond between the substrate and the chip, when the adhesive solidifies. Conventionally, the adhesive is applied along the flange of the chip to flow by capillary action into the space between the substrate and the bottom of the chip.

However, the conventional method of applying the adhesive on the metal bumps has some defects that need to be overcome and are hereinafter listed.

1. Because of the varied specifications of chips, the arrangement of metal bumps on chips with different specifications accordingly are positioned differently. Therefore the adhesive distribution is greatly affected by the different arrangements of the metal bumps. With reference to FIG. 6, multiple metal bumps (51) are disposed on the bottom of a chip (50), and adhesive (60) is provided along an edge of the chip (50) and flows to the metal bumps (51). Since the bumps (51) are disposed non-uniformly, for example, the arrangement density in region "a" is higher than that in region "b", the adhesive (60) that flows to region "a" flows faster than the adhesive (60) that flows to region "b". When an empty region exists on the chip (50), such as the region indicated by "c", the adhesive (60) flowing to metal bumps (51) formed around the empty region "d" is very difficult to control.

2. Since the adhesive is difficult to control, the adhesive usually cannot be completely applied in a single application but needs to be applied repeatedly. Therefore the efficiency of such a process is very low.

3. Because the speed that the adhesive flows is not easy to control and the adhesive needs to be repeatedly applied to the metal bumps, the opportunity for air bubbles to form in the adhesive is extremely high. When the flip-chip semiconductor product is heated in subsequent processes, the air bubbles formed in the adhesive will expand and explode damage or break the structure of the flip-chip semiconductor product.

To overcome the shortcomings, the present invention provides a method to control the speed that the adhesive applied to a flip-chip semiconductor product flows to mitigate and obviate the aforementioned problems.

SUMMARY OF THE INVENTION

An objective of the invention is to provide a method of controlling the adhesive distribution on a flip-chip semiconductor product thereby causing the adhesive to be distributed uniformly and to prevent the generation of air bubbles in the adhesive.

Other objects, advantages and novel features of the invention will become more apparent from the following detailed description when taken in conjunction with the accompanying drawings.

DETAILED DESCRIPTION OF THE INNTION

A method for controlling the adhesive distribution in a flip-chip semiconductor product mainly comprises the following steps:

(a) providing a substrate having a flip-chip mounted thereon, wherein multiple metal bumps are formed on a bottom of the flip-chip and are electrically mounted on the substrate;

(b) providing an dam on the substrate and along an edge of the flip-chip, wherein a gap exists between the dam and the edge of the flip-chip to allow adhesive to flow under the flip-chip; and (c) depositing adhesive on the dam to flow into the gap and to fill the space between the substrate and the bottom of the flip-chip.

Figure 1:
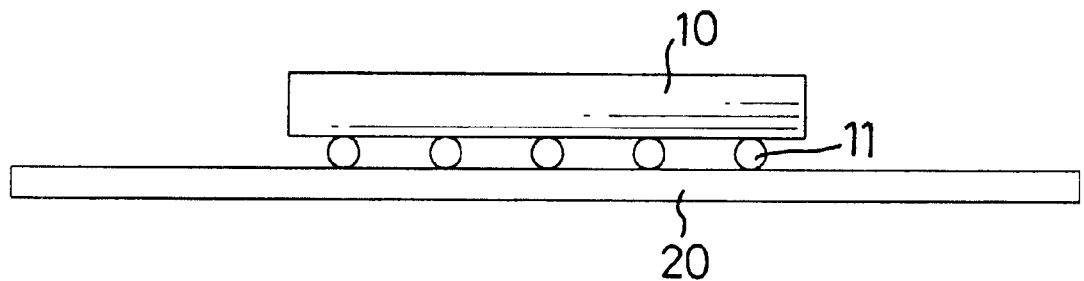
FIG. 1 is a side plan view of a flip-chip semiductor product mounted on a substrate in accordance with the present invention.

With reference to FIG. 1, in the step (a), a flip-chip (10) with a bottom is electrically mounted on a substrate (20) via multiple metal bumps (11) that are arranged on the bottom of the flip-chip (10), wherein a space is defined between the bottom of the flip-chip (10) and the substrate (20).

Figure 2:
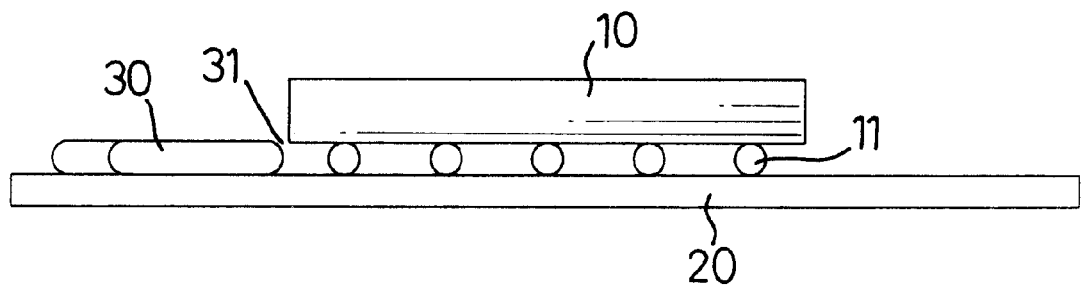
FIG. 2 is a side plan view showing an dam disposed along an edge of the flip-chip in FIG. 1.

With reference to FIG. 2, in the step (b), a dam (30) is positioned on the substrate (20) along an edge of the flip-chip (IO), wherein a gap (31) is defined between the dam (30) and the edge of the flip-chip (10).

Figure 3:
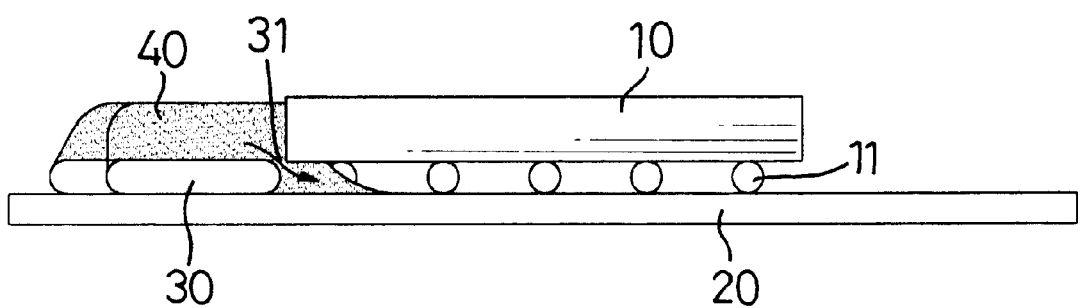
FIG. 3 is side plan view showing adhesive applied on the dam in FIG. 2.

With reference to FIG. 3, in the step (c), adhesive (40) is applied on the dam (30) and flows into the space between the flip-chip (10) and the substrate (20) through the gap (31) by capillary action.

The material of the dam (30) may be chosen from a solidified colloid that has different viscosity and composition from the adhesive (40), or the dam (30) may be a protrusion integrally formed with the substrate (10).

Figure 4:
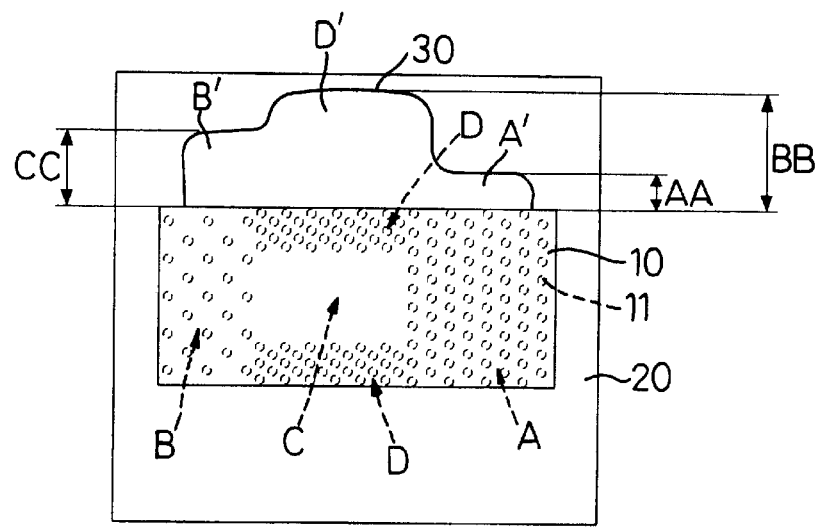
FIG. 4 is a top plan view showing the dam disposed along the edge of the flip-chip in FIG. 2.

With reference to FIG. 4, the shape of the dam (30) is varied based on the density of the metal bumps (11). For example, the dam (30) shown in FIG. 4 has three portions (A', B' and C') with different widths (AA, BB, and CC). The bottom surface of the chip (10) is substantially divided to several regions (A, B, C and D), wherein the arrangement density of the metal bumps (11) in each region (A, B, C and D) is different. In this embodiment, the order of arrangement density from the highest to the lowest is D, A, B to C, wherein region (C) is an empty region and no metal bumps (11) are formed on region (C).

Figure 5:
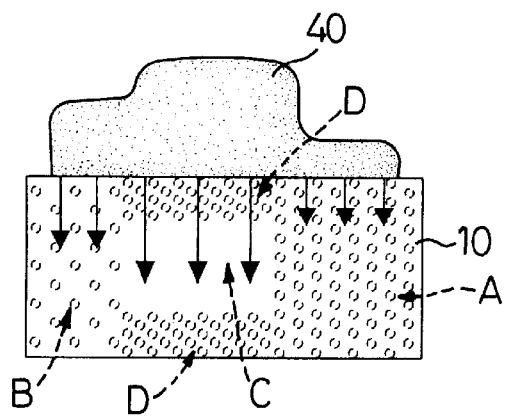
FIG. 5 is an operational top plan view showing the adhesive flowing to the metal bumps arrange the bottom surface of the chip in accordance with the present invention.
Figure 6:
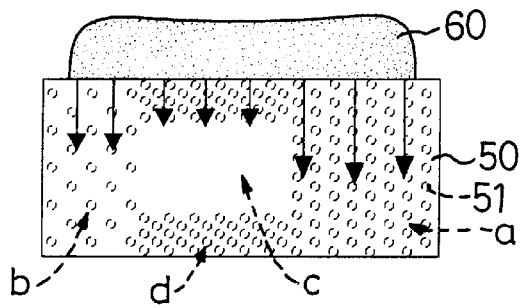
FIG. 6 illustrates a conventional way that-adhesive flows to the metal bumps.

In accordance with the principle of capillary action, the more dense the paths in media through which fluid can flow, the faster the fluid will flow. With reference to FIG. 5, since the bump density in the region (A) and the number of resultant capillary paths is higher than that in region (B), the speed that the adhesive (40) flows in region (A) is faster than that in region (B).

Thus the dam (30) provides two portions (A') and (B') with different sizes to hold different quantities of adhesive (40) to balance the flowing speed of the adhesive (40) in different regions. The portion (A') holds less adhesive (40) than the portion (B') does, thus the fluid pressure caused by adhesive (40) in portion (B') is higher than that caused by adhesive (40) in portion (A'), whereby the flowing speed in portion (B') is faster than the flowing speed in portion (A'). However, the density in portion (A) is much denser than that in portion (B). Therefore by considering the quantity of the adhesive (40) and the density of the metal bumps (11) on the flip-chip (20) simultaneously, the speed that the adhesive (40) flows in each region is controlled to be substantially equal, so a uniform adhesive distribution is easy to obtain and the generation of air bubbles within the adhesive (40) is prevented.

Still with reference to FIG. 5, region (D) has the densest arrangement of metal bumps (11), however an empty region (C) exists in the central portion of the region (D) to delay the flowing of the adhesive (40), therefore the dam (30) corresponding to region (D) has the largest area (D') to hold a significant quantity of the adhesive (40).

From the foregoing description, the method in accordance with the present invention has the following advantages:

1. By providing an dam with a specific shape based on the density of the metal bumps on the flip-chip, the flowing speed of the adhesive is able to be controlled much more precisely, and a uniform adhesive distribution can be obtained.

2. Adhesive is deposited on the dam only once, and the adhesive does not need to be deposited at the edge of the flip-chip over and over again. Thus the efficiency of the adhesive providing procedure is greatly increased in comparison with the previously mentioned prior art.

3. Since the adhesive is controlled to flow uniformly, the probability of the generation of air bubbles is low, and the quality of such a flip-chip semiconductor product is high.

The invention may be varied in many ways by a skilled person in the art. Such variations are not to be regarded as a departure from the spirit and scope of the invention, and all such modifications are intended to be included within the scope of the following claims.

What is claimed is:

1. A method for controlling adhesive distribution in a flip-chip semiconductor product, the method comprising steps of:

providing a substrate having a flip-chip mounted on the substrate, wherein multiple bumps are formed on a bottom surface of the flip-chip and the bumps are electrically attached to the substrate;

providing an dam on the substrate and along an edge of the flip-chip, wherein a gap is defined between the dam and a side of the flip-chip, and the shape of the dam varies based on the density of the bumps; and depositing adhesive on the dam to flow through the gap and into a space between the bottom surface of the flip-chip and the substrate, so that the space is filled with adhesive, wherein a flowing speed of the adhesive is controlled by the shape of the dam to be equal, wherein the shape of the dam is viewed from a top plan view of the dam, so that a uniform adhesive distribution is obtained.

2. The method as claimed in claim 1, wherein the adhesive is dropped on a top surface of the dam, the top surface comprising a first portion with a first area and a second portion with a second area that is smaller than the first area, wherein the bottom surface of the flip-chip comprises a first region with a first bump density and a second region with second bumps that is denser than the first bump density, wherein the first and the second portions respectively correspond to the first region and the second region.

3. The method as claimed in claim 1, wherein the dam is a solidified colloid differing from the adhesive.

4. The method as claimed in claim 2, wherein the dam is a solidified colloid differing from the adhesive.

5. The method as claimed in claim 1, wherein the dam is a protrusion integrally formed with the substrate.

6. The method as claimed in claim 2, wherein the dam is a protrusion integrally formed with the substrate.

\* \* \* \* \*